(12) United States Patent
Tsai et al.

(10) Patent No.: US 8,324,658 B2
(45) Date of Patent: Dec. 4, 2012

(54) ESD PROTECTION CIRCUIT FOR RFID TAG

(75) Inventors: Ming-Hsien Tsai, Sindian (TW);
Chewn-Pu Jou, Hsinchu (TW);
Fu-Lung Hsueh, Cranbury, NJ (US);
Ming-Hsiang Song, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 288 days.

(21) Appl. No.: 12/759,743

(22) Filed: Apr. 14, 2010

(65) Prior Publication Data

US 2011/0186909 A1 Aug. 4, 2011

Related U.S. Application Data

(60) Provisional application No. 61/300,150, filed on Feb. 1, 2010.

(51) Int. Cl.
*H01L 29/73* (2006.01)

(52) U.S. Cl. .. 257/173; 257/361; 257/362; 257/E29.181

(58) Field of Classification Search .................. 257/173, 257/361, 362, E29.181
See application file for complete search history.

(56) References Cited

U.S. PATENT DOCUMENTS

| | | | |
|---|---|---|---|
| 6,323,074 B1 | 11/2001 | Jiang et al. | |
| 7,323,752 B2 | 1/2008 | Chu et al. | |
| 7,394,133 B1 | 7/2008 | Vashchenko et al. | |
| 7,411,767 B2 | 8/2008 | Huang et al. | |
| 7,420,250 B2 | 9/2008 | Lee et al. | |
| 2008/0277728 A1* | 11/2008 | Huang | 257/357 |

OTHER PUBLICATIONS

Lee J., et al., "A high sensitivity, CoSi2-Si Schottky diode voltage multiplier for UHF-band passive FRID tag chips", IEEE Microwave Wireless Components Letters, Dec. 2008, 18(12):830-832.
Bauer-Reich, C. et al., "The effects of ESD in multiple testing environments on adhesive-label RFID tags," IEEE Int. Electromagn. Compat. Symp., Jul. 2007, pp. 1-6.
De Vita, G. et al., "Design criteria for the RF section of UHF and microwave passive RFID transponders", IEEE Transactions on Microwave Theory Technology, Sep. 2005, 53(9):2978-2990.
Yao, Y. et al., "A fully integrated 900-MHz passive RFID transponder front end with novel zero-threshhold RF-DC rectifier", IEEE Transactions on Industrial Electronics, Jul. 2009, 56(7):2317-2325.
Tran, N. et al., "Development of long-range UHF-band RFID tag chip using Shottky diodes in standard CMOS technology", Proc. IEEE RFIC Symp., Jun. 2007, pp. 281-284.
Lee, J., et al., "Design consideration of UHF RFID tag for increased reading range", IEEE MTT-S Int. Microwave Symp., 2006, pp. 1588-1591.

(Continued)

*Primary Examiner* — Minh-Loan T Tran
(74) *Attorney, Agent, or Firm* — Duane Morris LLP

(57) ABSTRACT

An electrostatic discharge (ESD) protection circuit structure includes a dual directional silicon controlled rectifier (SCR) formed in a substrate. The SCR includes first and second P-wells laterally interposed by an N-well. A deep N-well is disposed underneath the P-wells and the N-well. First and second N-type regions are disposed in the first and second P-wells, respectively, and are coupled to a pair of pads. First and second P-type regions are disposed in the first and second P-wells, respectively, are coupled to the pads, and are disposed closer to the N-well than the first and second N-type regions, respectively.

16 Claims, 8 Drawing Sheets

OTHER PUBLICATIONS

Cantantore, E. et al. "A 13.56-MHz RFID system based on organic transponders", IEEE J. Solid-state Circuits, Jan. 2007, 42(1):84-92.
Liu, Z. et al., An Improved Bidirectional SCR Structure for Low-Triggering ESD Protection Applications, IEEE Electron Device Letters, Apr. 2008, 29(4):360-362.
Liu, J. et al., "A Dual-polarity SCR for RF IC ESD Protection", IEEE Communications, Circuits and Systems, May 2008, pp. 1228-1230.
Khaw, M. et al., "Implementation of international mixed signal ESD protection onto RFID transponder IC", IEEE International Conference on Semiconductor Electronics, Oct. 2006, pp. 901-905.

* cited by examiner

ESD PROTECTION CIRCUIT FOR RFID TAG

CROSS-REFERENCE TO RELATED APPLICATIONS

This application claims priority under 35 U.S.C. §119(e) from copending Provisional Application Ser. No. 61/300,150, filed Feb. 1, 2010, the entirety of which is hereby incorporated by reference herein.

BACKGROUND

Electrostatic discharge (ESD) is a serious problem confronting circuit designers. Electrostatic voltages can build up from a variety of environmental sources and can reach thousands or even tens of thousands of volts. During discharge, high transient currents can damage equipment by generating high temperatures that can melt circuit components.

An ESD protection circuit is typically added to integrated circuits (ICs) at bond pads. The pads are the connections to outside circuits, for all electric power supplies, electric grounds, and electronic signals. An ESD protection circuit has two states: normal operation mode and ESD mode. When an IC is in the normal operation mode, the ESD protection circuit appears invisible to the IC by blocking current through itself. In the ESD mode, the ESD protection circuit serves its purpose of protecting the IC by conducting an electrostatic charge quickly to VSS, or ground, before damage can occur to the internal circuit.

ESD protection is an important consideration for the design and manufacture of radio frequency identification (RFID) tags. An RFID tag, also known as an RFID transponder, is a device used to communicate with an RFID reader (also known as interrogator) in an RFID system. Tags can be active, semi-active, or passive. Active tags carry power supplies, which power RFID circuitry and communicate with the reader. The power supply for a semi-active tag is used to power the electronics but not to communicate with the reader. A passive tag relies entirely on the reader to provide sufficient energy to operate the circuitry and communicate with the reader. In a passive RFID tag, the input pin for an antenna is connected to a metal-insulator-metal (MIM) capacitor followed by diodes for signal detection. Static electricity is commonly generated during the manufacturing of RFID labels, and the MIM structure is at risk of being damaged during the process of assembling the antenna. It is therefore important to provide an ESD bypass path to prevent ESD events during antenna assembly and testing.

Conventional ESD protection circuits may alter the input impedance of RFID circuits at a frequency of interest, resulting in significantly degraded power transfer efficiency and thereby placing practical limits on the extent of ESD protection that is possible in an RFID tag using conventional techniques. An RFID ESD protection device should provide a low impedance path to route ESD current around an underlying core RFID circuit during ESD events while being transparent to the core circuit during normal RF operation. The input power from an RFID antenna may be up to 0 dBm, corresponding to an amplitude of about 7 V.

Conventional ESD protection circuits are unsuitable for large signal (high swing) RFID operation due to a low trigger voltage that disadvantageously results in ESD protection turn-on during normal RF operation. Conventional ESD protection circuits are also susceptible to latching up (remaining in an ON state) due to a low holding voltage that does not allow ESD protection turn-off.

It is desirable to protect circuitry in an RFID tag without exhibiting the latch-up problem and without interfering with normal RFID operation.

SUMMARY

An embodiment discloses an electrostatic discharge (ESD) protection circuit structure that comprises a dual directional silicon controlled rectifier (SCR) formed in a substrate. The SCR includes first and second P-wells laterally interposed by an N-well. A deep N-well is disposed underneath the P-wells and the N-well. First and second N-type regions are disposed in the first and second P-wells, respectively, and are coupled to a pair of pads. First and second P-type regions are disposed in the first and second P-wells, respectively, are coupled to the pads, and are disposed closer to the N-well than the first and second N-type regions, respectively.

Another embodiment is an RFID device having dual directional ESD protection. The RFID device comprises a core RFID module and a dual directional ESD protection circuit. The dual directional ESD protection circuit comprises first and second parasitic bipolar NPN transistors and a parasitic bipolar PNP transistor. The first NPN transistor and the PNP transistor define a first silicon-controlled rectifier (SCR), and the second NPN transistor and the PNP transistor define a second SCR. The first and second SCRs provide pathways to discharge electrostatic potentials of first and second polarities. The ESD protection circuit has a trigger voltage above a maximum expected amplitude of an RF input signal to the core RFID module during normal operation to protect the core RFID module without interfering with the normal operation of the RFID module in the absence of an electrostatic discharge (ESD) event.

Another embodiment is an RFID tag having dual directional ESD protection. The RFID tag comprises a core RFID module and a dual directional SCR formed in a substrate. The dual directional SCR includes first and second P-wells laterally interposed by an N-well. The dual directional SCR also includes a deep N-well disposed underneath the P-wells and the N-well. First and second N-type regions are disposed in the first and second P-wells, respectively, and are coupled to a pair of pads. First and second P-type regions are disposed in the first and second P-wells, respectively, are coupled to the pads, and are disposed closer to the N-well than the first and second N-type regions, respectively. The dual directional SCR is configured to provide a trigger voltage in excess of 15 V.

The construction and method of operation of disclosed embodiments, however, together with additional objects and advantages thereof will be best understood from the following descriptions of specific embodiments when read in connection with the accompanying figures.

BRIEF DESCRIPTION OF THE DRAWINGS

The following will be apparent from elements of the figures, which are provided for illustrative purposes and are not necessarily to scale.

DETAILED DESCRIPTION

Presently disclosed embodiments address some or all of the foregoing deficiencies of conventional ESD protection circuits and provide dual polarity (dual directional) ESD protection for RFID applications with latch-up immunity and with transparency during normal RFID operation.

Figure 1:
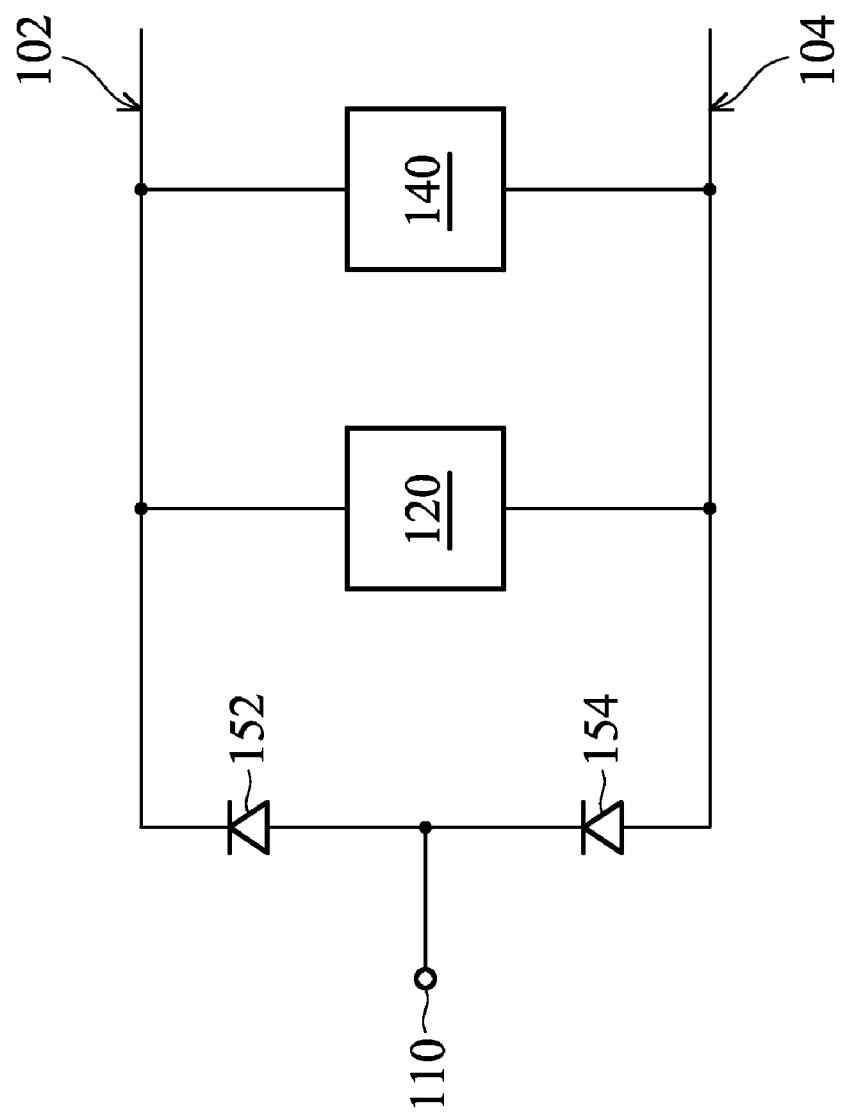
FIG. 1 illustrates a conventional ESD protection system using a dual-diode configuration.

FIG. 1 illustrates a conventional ESD protection system using a dual-diode configuration. Diodes 152, 154 and a power clamp 140 provide ESD protection for a core circuit 120 powered by VDD power line 102 and VSS power line 104. If an ESD event occurs, e.g., resulting in an electrostatic potential at a pad 110 that is significantly higher than VDD relative to VSS, the electrostatic potential is discharged to VSS line 104 via diode 152 and power clamp 140, thereby routing transient ESD current around the core circuit 120. A deficiency of this approach when used with large-signal RFID operation is that due to voltages that may rise as high as 7 V, the dual diode configuration may turn on inappropriately, causing large leakage current and impacting normal RFID operation and performance.

Figure 2:
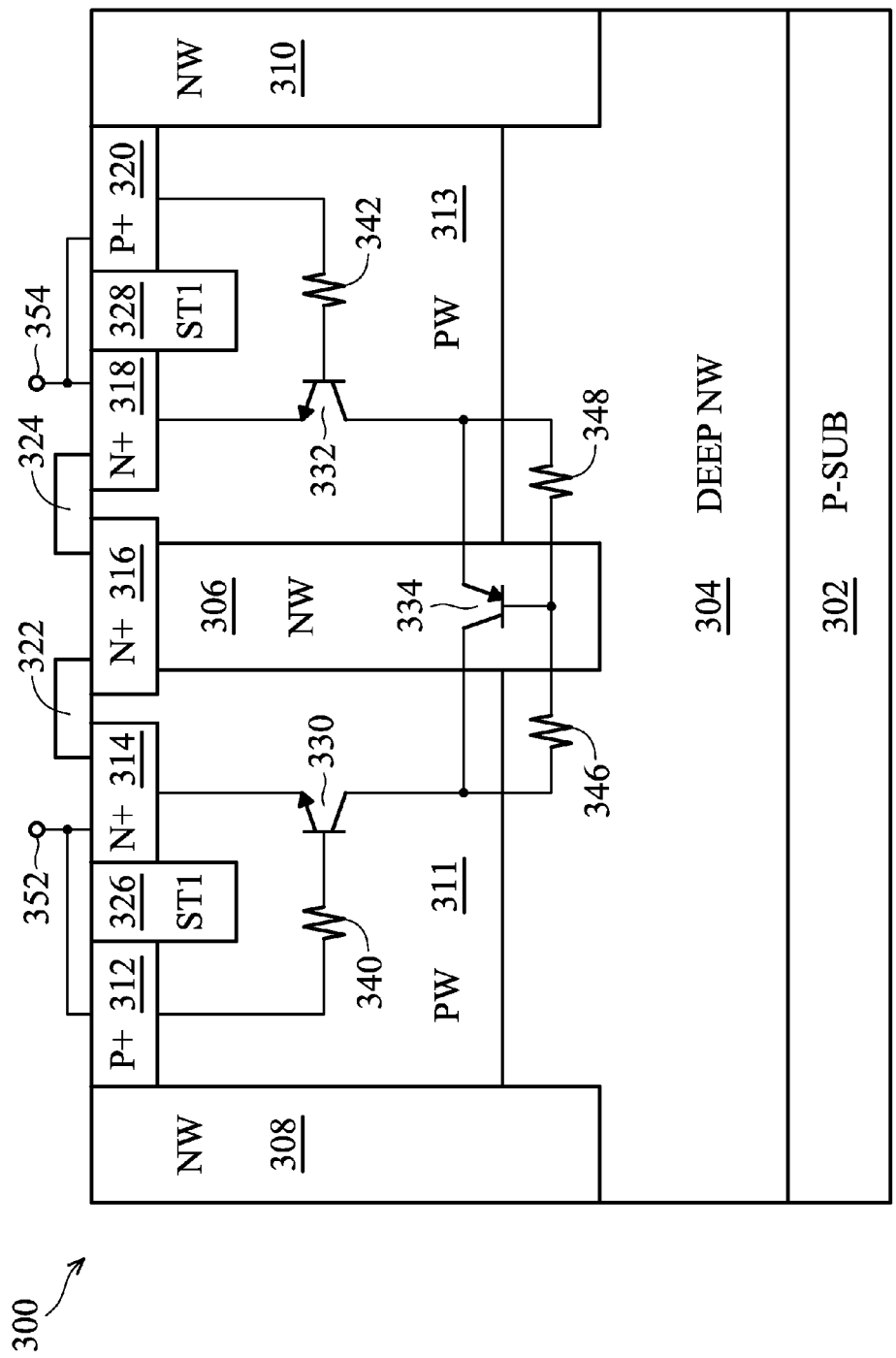
FIG. 2 illustrates a cross-sectional view of a conventional RFID ESD protection circuit structure.

FIG. 2 illustrates a cross-sectional view of one conventional RFID ESD protection circuit structure 300. A deep N-well 304 is disposed above a P-type substrate 302. N wells 306, 308, 310 are disposed above the deep N-well 304. It should be understood that N-wells 306, 308, 310 may be formed as a single N-well but are displayed and labeled separately in the cross-sectional view of FIG. 2 for convenience. P+ doped region 312 and N+ doped region 314 are disposed in P-well 311, are laterally interposed by a shallow trench isolation (STI) 326, and are coupled to a pad 352. P+ doped region 320 and N+ doped region 318 are disposed in P-well 313, are laterally interposed by an STI 328, and are coupled to a pad 354. A gate 322 is disposed between N+ doped region 314 and N+ doped region 316, and a gate 324 is disposed between N+ doped region 316 and N+ doped region 318. Parasitic bipolar NPN transistors 330, 332 are formed in P-wells 311, 313, and a parasitic bipolar PNP transistor 334 is formed in N-well 306. Also shown are parasitic resistors 340, 342, 346, and 348. An N-P-N-P-N path between pad 352 and pad 354, formed by N+ doped region 314, P-well 311, N-well 306, P-well 313, and N+ doped region 318, provides dual directional ESD protection. Gates 322, 324 add parallel ground-gate NMOS transistors into the structure to lower the trigger voltage to about 6.74 V. The conventional ESD protection circuit structure 300 is designed to target a low trigger voltage and a low holding voltage (about 4.2 V) in order to increase turn-on speed. However, such an ESD protection implementation is not suitable for RFID applications with large signal swing because of the resulting interference with normal RFID operation.

Figure 3A:
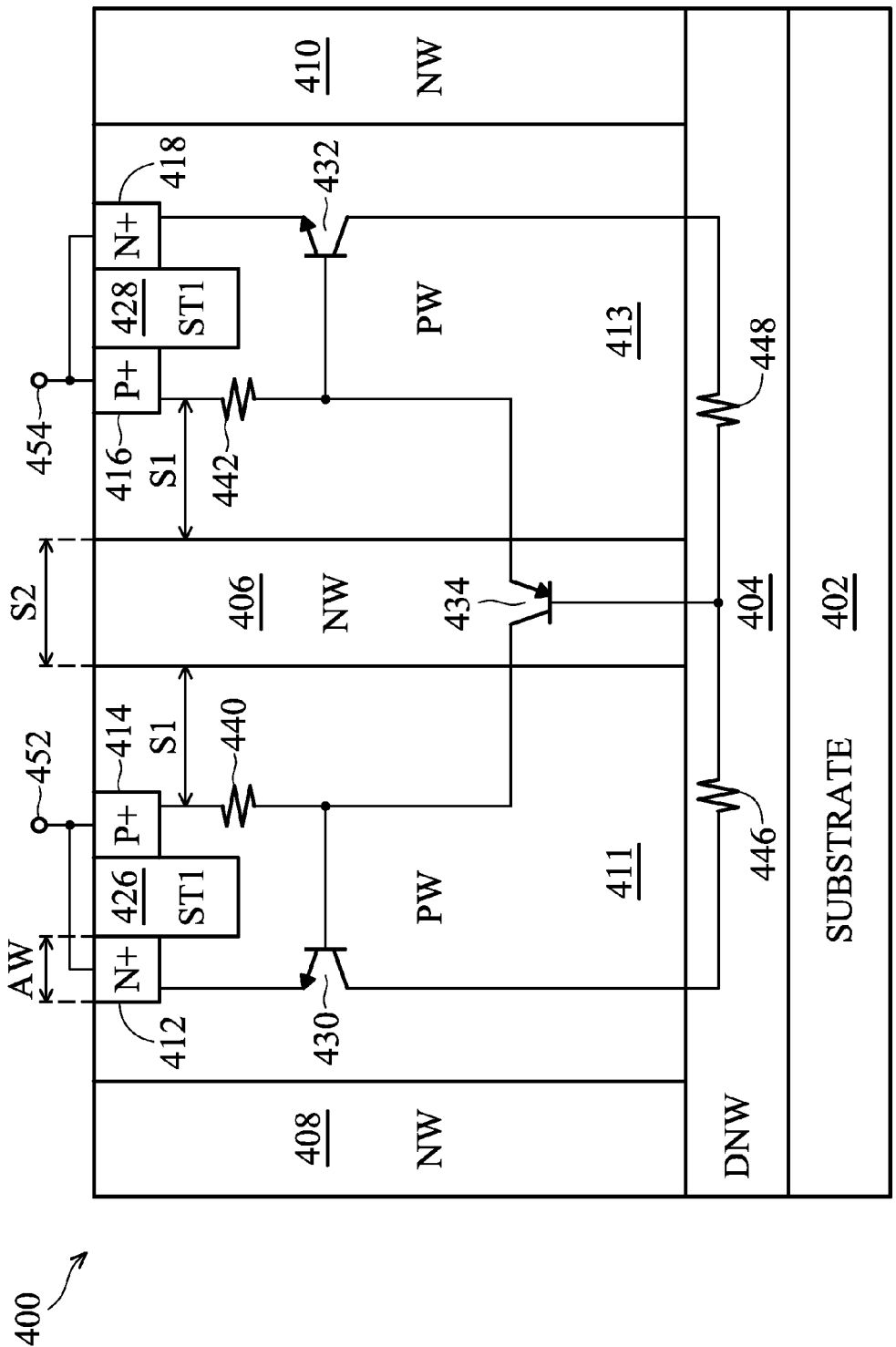
FIG. 3A illustrates a cross-sectional view of an ESD protection circuit structure in accordance with a disclosed embodiment.

FIG. 3A illustrates a cross-sectional view of an ESD protection circuit structure 400 in accordance with a disclosed embodiment. A deep N-well 404 is disposed above a substrate 402. A central N-well 406 and side N-wells 408, 410 are disposed above the deep N-well 404. It should be understood that N-wells 406, 408, 410 may be formed as a single N-well, as illustrated in the plan view of FIG. 3B, but are displayed and labeled separately in the cross-sectional view of FIG. 3A for convenience. A P-type region 414 and an N-type region 412 are disposed in P-well 411, are laterally interposed by an isolation region 426 that may be an STI, and are coupled to a pad 452 that may provide a connection to a VSS power supply. P-type region 416 and N-type region 418 are disposed in P-well 413, are laterally interposed by an isolation region 428 that may be an STI, and are coupled to a pad 454 that may provide a connection to an antenna of an RFID tag. P-type regions 414, 416 and N-type regions 412, 418 may be heavily doped, as indicated by P+ and N+ in FIG. 3A, and are henceforth referred to as P+ doped regions 414, 416 and N+ doped regions 412, 418 for convenience. P+ doped regions 414, 416 are each disposed closer to the central N-well 406 than are N+ doped regions 412, 418. Parasitic bipolar NPN transistors 430, 432 are formed in P-wells 411, 413, and a parasitic bipolar PNP transistor 434 is formed in N-well 406. Also shown are parasitic resistors 440, 442, 446, 448.

Dual directional ESD protection is provided by the N-P-N-P-N configuration that includes two parasitic silicon-controlled rectifiers (SCRs). When pad 452 is subjected to a positive ESD potential relative to pad 454, a first parasitic SCR provides a conductive pathway from pad 452 to pad 454 via P+ doped region 414, P-well 411, N-well 406, P-well 413, and N+ doped region 418. When pad 452 is subjected to a negative ESD potential relative to pad 454, a second SCR provides a conductive pathway from pad 454 to pad 452 via P+ doped region 416, P-well 413, N-well 406, P-well 411, and N+ doped region 412. The first parasitic SCR corresponds to transistors 432, 434 and is triggered by avalanche breakdown of transistor 434. The second parasitic SCR corresponds to transistors 430, 434 and is also triggered by avalanche breakdown of transistor 434. The pair of SCRs may be referred to as a dual directional SCR. In an embodiment (not shown), all regions that are shown as being doped N-type in FIG. 3A are instead doped P-type, and vice versa. Thus, various embodiments provide N-P-N-P-N or P-N-P-N-P configurations.

Silicide regions may be formed over the substrate to provide contact points to the pads 452, 454 from the implant regions 412, 414, 416, 418. The ESD protection circuit structure 400 may be fabricated without a resistive protective oxide (RPO) mask.

The use of the aforementioned N-P-N-P-N structure 400 for the dual-SCR structures provides for a higher trigger voltage appropriate for large signal swing RFID applications. Providing regions 412, 418 as N+ regions and regions 414, 416 as P+ regions helps increase the trigger voltage relative to the prior art structure where the polarities are reversed. With structure 400, a low parasitic capacitance of 34 fF has been measured. The side N-wells 408, 410 and the deep N-well 404 at the bottom isolate the ESD protection circuit structure 400 from other devices in the substrate 402. Parasitic resistors 440, 442, 446, 448 inside the circuit structure 400 may help with fast triggering.

The ESD protection circuit structure 400 may be fabricated in accordance with 0.18 μm, 0.13 μm, or lower mixed-signal CMOS processes. The width of N+ doped region 412, P+ doped region 414, P+ doped region 416, and N+ doped region 418 is shown in FIG. 3A as AW and may be between 1 and 5 μm for an ESD protection circuit structure fabricated using 0.18 μm CMOS and between 0.8 and 4 μm for 0.13 μm CMOS. The separation distance between each of P+ doped regions 414, 416 and N-well 406 is shown as S1 and may be between 0.43 and 3 μm for 0.18 μm CMOS and between 0.38 and 3 µm for 0.13 µm CMOS. The width of N-well 406 is shown as S2 and may be between 0.86 and 3 µm for 0.18 µm CMOS and between 0.8 and 3 µm for 0.13 µm CMOS.

Figure 3B:
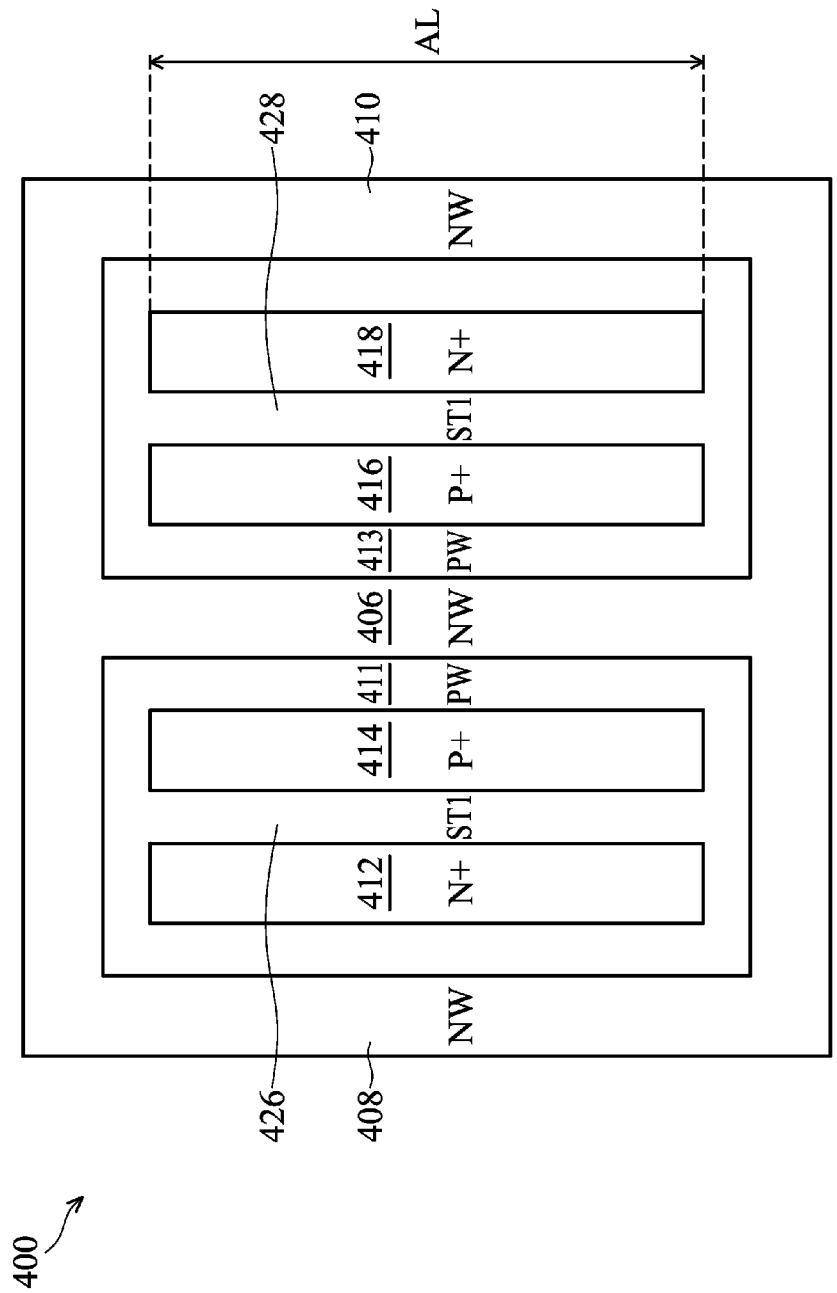
FIG. 3B illustrates a plan view of an ESD protection circuit structure in accordance with a disclosed embodiment.

FIG. 3B illustrates a plan view of the ESD protection circuit structure 400. The length of N+ doped region 412, P+ doped region 414, P+ doped region 416, and N+ doped region 418 is shown in FIG. 3B as AL and may be between 10 and 80 µm for 0.18 µm CMOS and between 6 and 80 µm for 0.13 µm CMOS. The size of the ESD protection circuit structure shown in the plan view of FIG. 3B may be 24.7 µm×42.5 µm for 0.18 µm CMOS and may be that size or smaller for 0.13 µm CMOS.

The trigger voltage and the holding voltage are factors associated with ESD protection behavior. The parameters AL and AW impact the trigger voltage, and the parameters S1 and S2 impact the holding voltage. For an efficient design in terms of area, the geometry of a disclosed embodiment has a relatively large AL/AW ratio so that the overall current handling capability can be enhanced with a reduced parasitic resistance. A value for AW of 2 µm and for AL of 30 um may be used to provide a large ESD current capability and a small parasitic capacitance, e.g., 34 fF or less. Minimizing S1 and S2 increases ESD robustness by lowering the holding voltage. There is a trade-off between ESD robustness (i.e., staying "on") and latch-up immunity, i.e., not remaining "on" inappropriately; this trade-off corresponds to a design window within which embodiments advantageously operate. For 0.18 µm CMOS, the ratio S1/S2 may be between about 0.5 and about 3.5, the ratio S1/AW may be between about 0.5 and about 3.0, and the ratio S2/AW may be between about 0.3 and about 3.0. For 0.13 µm CMOS, the ratio S1/S2 may be between about 0.5 and about 3.75, the ratio S1/AW may be between about 0.5 and about 3.0, and the ratio S2/AW may be between about 0.3 and about 3.0.

The ESD protection circuit structure 400 utilizes as much contact and via density as possible to reduce series resistance. Such a design approach allows a large ESD current bypass capability with minimum area and minimum parasitic capacitances.

The N+ doped regions 412, 418 and the P+ doped regions 414, 416 may have respective N-type and P-type doping concentrations between $10^{15}$ and $10^{16}$ ion/cm² when fabricated with 0.18 µm CMOS and between $2\times10^{15}$ and $3\times10^{16}$ ion/cm² when fabricated with 0.13 µm CMOS. The depth of the N+ doped regions 412, 418 and P+ doped regions 414, 416 may be between 0.03 and 0.04 µm for 0.18 µm CMOS and between 0.025 and 0.035 µm for 0.13 µm CMOS.

The doping concentration of N-well 406 (and equivalently, N-wells 408, 410) may be between $10^{13}$ and $10^{14}$ ion/cm² for 0.18 µm CMOS and 0.13 µm CMOS. The doping concentration of deep N-well 404 may be between $10^{12}$ ion/cm² and $2\times10^{13}$ ion/cm² for 0.18 µm CMOS and between $2\times10^{12}$ ion/cm² and $3\times10^{13}$ ion/cm² for 0.13 µm CMOS. Parasitic P-well resistances 440, 442 may be between 1000 Ohms and 5000 Ohms for 0.18 µm and 0.13 µm CMOS, and parasitic deep N-well resistances 446, 448 may be between 500 Ohms and 3000 Ohms for 0.18 µm and 0.13 µm CMOS.

Figure 4:
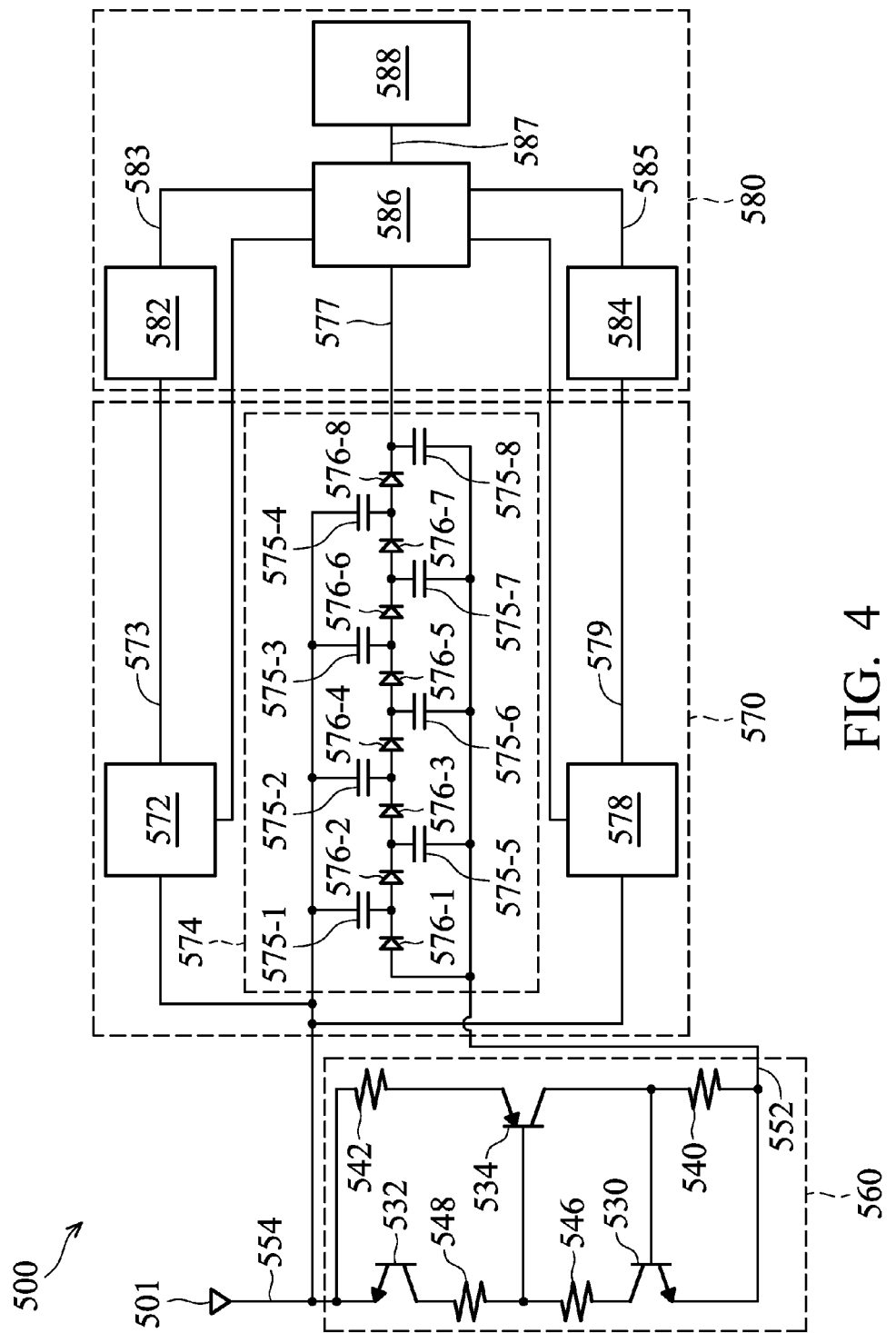
FIG. 4 is a block diagram of an RFID tag having ESD protection in accordance with another disclosed embodiment.

FIG. 4 is a block diagram of an RFID tag 500 having ESD protection in accordance with another disclosed embodiment. The ESD-protected RFID tag 500 may be a passive RFID tag that operates at UHF (860-960 MHz) and allows a reading range of few meters without the need for any external batteries or power generators. An antenna 501 provides an RF power line 554 to a core RFID module that may comprise an analog front end (AFE) 570. The core RFID module may also comprise a state machine 580 that interfaces with the AFE 570 and provides baseband processing. An ESD protection block 560 protects the core RFID module by providing conductive pathways in two directions (for positive and negative polarities of ESD events) between the antenna 501 and VSS power line 552.

The analog front end comprises a demodulator 572 that provides a demodulated signal 573, an RF/DC rectifier 574, and a modulator 578, which may be a backscatter modulator. As is known in the art, backscatter modulation, which is commonly used with passive and semipassive RFID tags that do not use a radio transmitter, refers to modulation of reflected (backscattered) power from the tag antenna 501. A current flowing on a transmitting antenna (not shown) induces a voltage on the receiving antenna 501. The induced voltage results in an induced current at the receiving antenna 501, which leads to radiation that returns to the transmitting antenna, inducing a voltage, and thereby producing a backscattered signal that can be detected. The RF/DC rectifier 574 has a charge pump (also called a voltage multiplier) and a voltage limiter. The RF-DC rectifier 574 converts a weak RF input signal 554 received by the antenna 501 into a stable DC supply voltage 577. The major design consideration for the voltage multiplier is to have a high RF-DC conversion efficiency, which determines the reading/writing distance and the sensitivity of the RFID tag. The voltage multiplier may be a Dickson voltage multiplier. The principle underlying a Dickson voltage multiplier is described in U.S. Pat. No. 5,831,469, "Multiplier Improved Voltage," which is hereby incorporated by reference herein in its entirety. As shown in FIG. 4, an embodiment uses a cascaded 4-stage Dickson multiplier employing MIM capacitors 575-1, ..., 575-8 (generally 575) and CoSi—Si Schottky diodes 576-1, ..., 576-8 (generally 576). The voltage multiplier circuit converts an RF input voltage up, so that with optimized design of Schottky diodes 576, 1 µm in length and 2 µm in width, a given loading condition and target minimal RF input power of −7.5 dBm and sufficient DC output voltage of 1.2 V are achieved. Compared with diode-connected MOS transistors, Schottky diodes have lower substrate loss, shorter charge/discharge time, and enhanced conversion efficiency owning to their small series resistance and junction capacitance and their low turn-on voltage.

The state machine 580 may include a decoder 582 that provides a decoded signal 583 and an encoder 584 that encodes a data line 585 to provide an encoded signal 579. The back end 580 may further include a logic and control circuit 586 and a memory 588 that communicate with each other via line 587. The state machine 580 may also include a baseband digital signal processing (DSP) block (not shown) as is known in the art.

The ESD protection block 560 of FIG. 4 is equivalent to the ESD protection circuit structure 400 and is labeled with similar reference numbers as in FIGS. 3A-B for ease of understanding. For example, bipolar transistors 430, 432, and 434 are equivalent to transistors 530, 532, and 534. Transistors 532, 534 and 530, 534 form a dual SCR configuration that protects the core RFID module comprising the AFE 570 and/or the back end 580.

A passive UHF RFID analog front end with ESD protection circuitry using dual-directional SCR in accordance with an embodiment has been fabricated in a 0.18-µm mixed-signal CMOS process. A 0.18-µm CMOS process may also be used. RFID front-end function measurements were performed on the printed circuit board (PCB), and ESD performance was tested on-wafer using the MM and HBM zap stress and TLP test.

Figure 5:
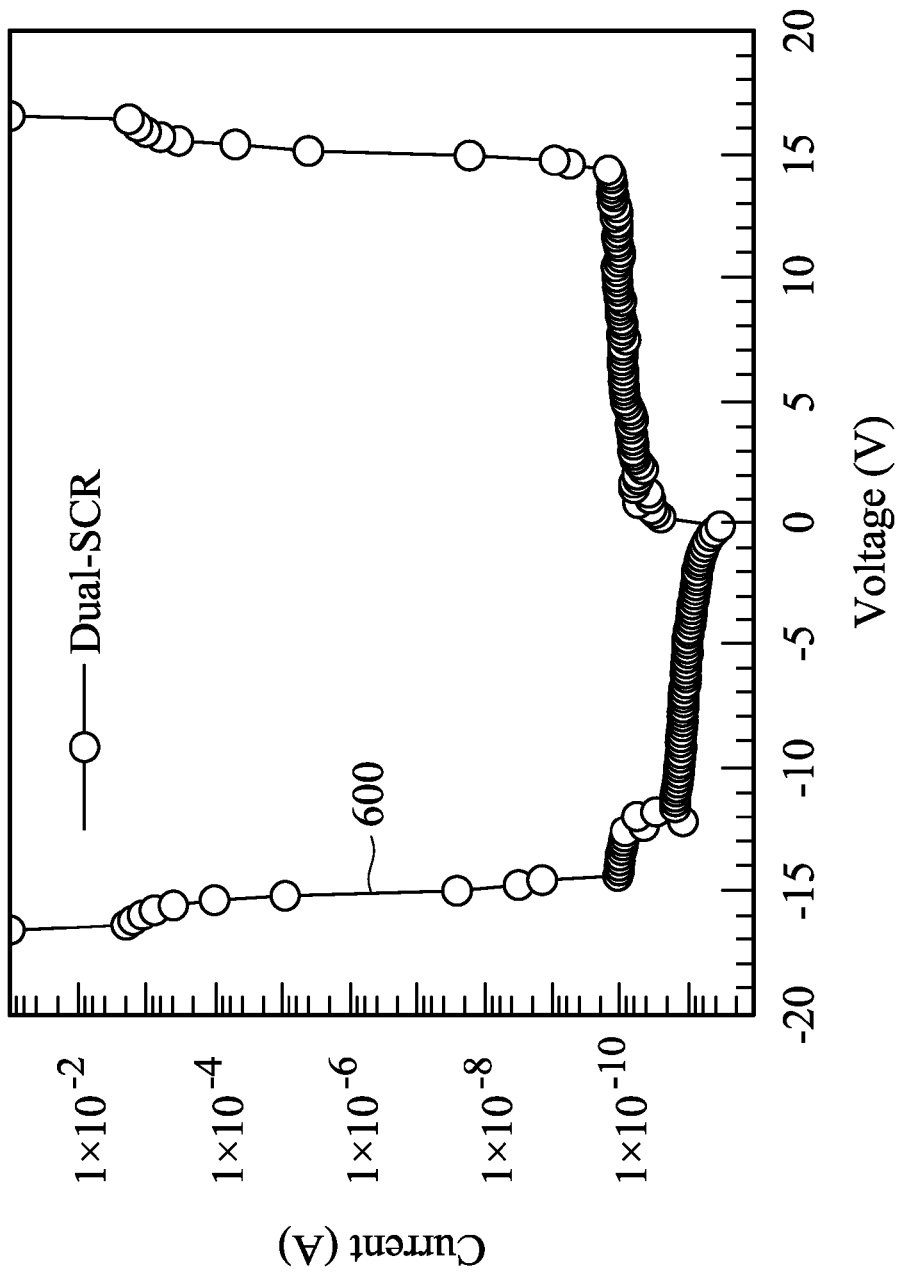
FIG. 5 is a current vs. voltage plot showing measured DC breakdown voltage of an ESD protection circuit in accordance with various disclosed embodiments.

FIG. 5 is a plot of current 600 vs. voltage showing measured DC breakdown voltage of an ESD protection circuit in accordance with various disclosed embodiments. FIG. 5 shows that ESD protection is transparent, i.e., in the OFF state, during normal RF operation. As shown in FIG. 5, the DC breakdown voltage can sustain a bias in a range from at least −15 V to at least 15 V.

Disclosed embodiments provide dual-directional SCR-based ESD protection with a high trigger voltage of about 16.9 V, which is higher than a maximum expected amplitude of an RF input signal to an underlying core RFID module during normal operation, and a low parasitic capacitance of about 34 fF. Such ESD protection performance is suitable for large signal operation for RFID. Measured results have indicated that the RFID AFE 570 can sustain ESD levels of 3.0 kV per the human-body-model (HBM) and 200 V per the machine-model (MM), respectively. The HBM testing model represents discharge from the fingertip of a standing person delivered to a device, and the MM represents a more extreme discharge scenario with a 200 pF capacitor discharged directly into a device.

Figure 6:
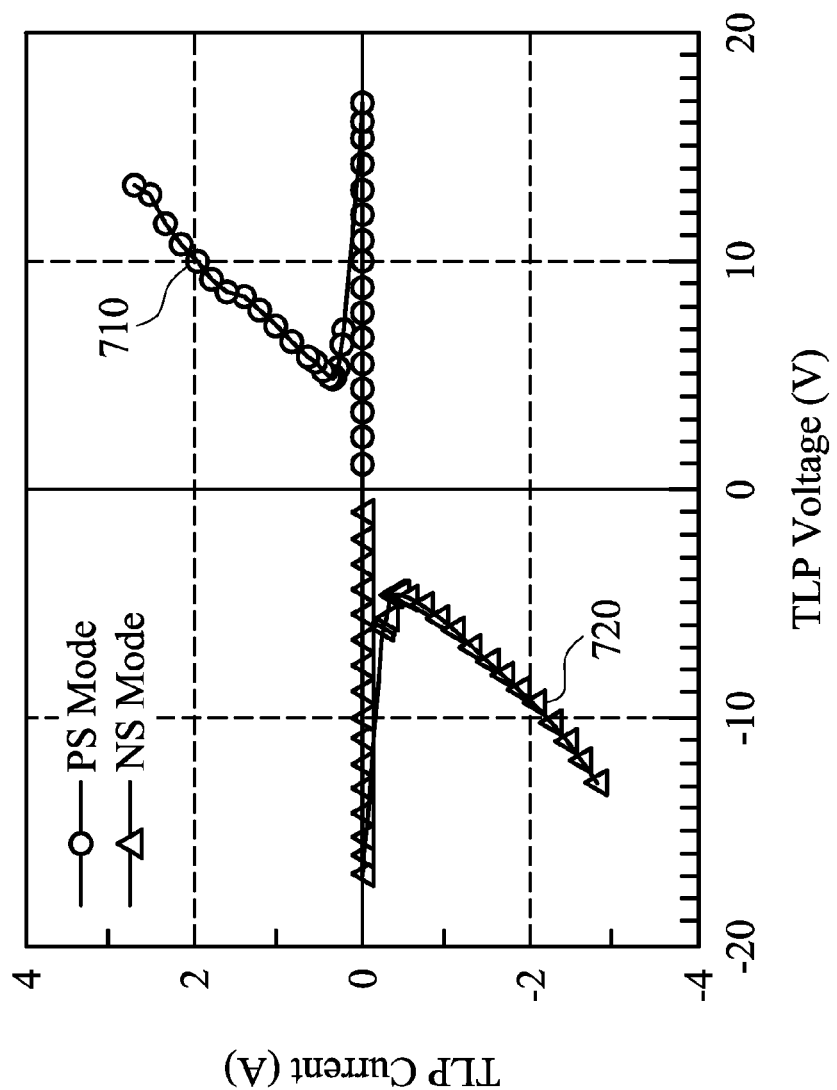
FIG. 6 is a current vs. voltage plot showing transmission line pulse (TLP) testing results for an ESD protection circuit in accordance with various disclosed embodiments.

FIG. 6 is a current vs. voltage (I-V) plot showing transmission line pulse (TLP) testing results for an ESD protection circuit in accordance with various disclosed embodiments. TLP is a technique used in industry to test IC technologies and circuit behavior in the context of ESD. The TLP I-V curves of the positive-ESD stress with respect to ground (PS) mode 710 and the negative-ESD stress with respect to ground (NS) mode 720 are almost symmetrical relative to the zero-biased voltage. The trigger voltage is about 16.9 V, and the snapback voltage is about 4.5 V.

Figure 7:
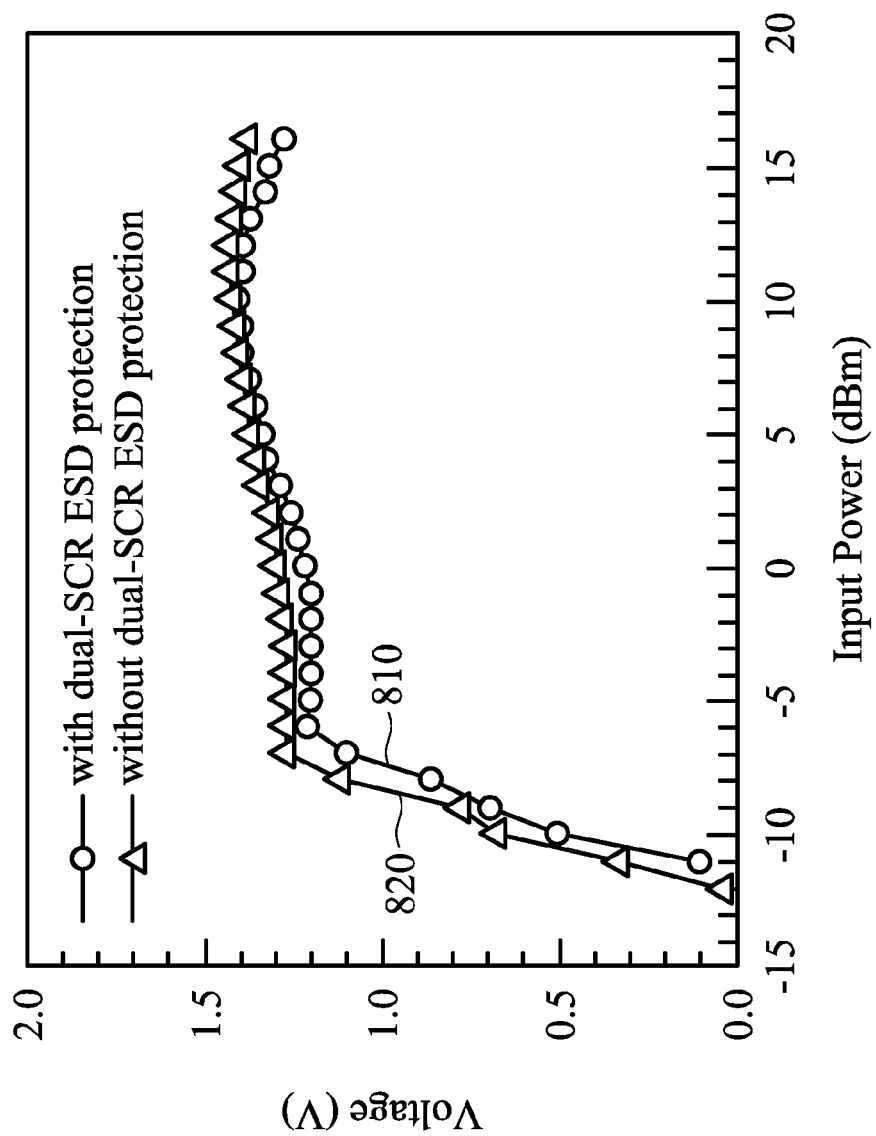
FIG. 7 is a voltage vs. power plot for an RF-DC rectifier of an RFID tag in accordance with a disclosed embodiment.

FIG. 7 is a voltage vs. power plot for an RF-DC rectifier of an RFID tag in accordance with a disclosed embodiment. As shown in FIG. 7, the RF-DC rectifier generates a stable power supply output about 1.2 V when the RF input power exceeds −7.5 dBm. The DC output voltage 810 with the ESD protection is almost identical with the output voltage 820 of a reference design that does not provide ESD protection, indicating that the dual-SCR structure of a disclosed embodiment with 34 fF parasitic capacitance has no impact on the power efficiency of the RF/DC rectifier at the frequency of interest. Table 1 summarizes the performance of the passive UHF RFID analog front-end with ESD protection in an embodiment.

TABLE 1

Summary of RFID Transponder Front-End Performance.

| Parameter | Performance |
| --- | --- |
| Technology | 0.18 μm CMOS |
| Output Voltage | 1.2 V @ 0 dBm input power and 0.33 mOhm load |
| Power | 2.4 μW |
| Operation Frequency | 860 MHz~960 MHz |
| ESD | 3.0 kV (HBM), 200 V (MM) |
| Transmitter Modulation | Backscatter |
| Die Core Area | 390 × 240 μm² |

The disclosed dual-SCR configuration, having a large trigger voltage of about 16.9 V and a large snapback voltage of about 4.7 V, prevents latch-up during normal RF operation and provides ESD protection for large-signal operation in RFID, capabilities that have not previously been available.

The above illustrations provide many different embodiments for implementing different features of this invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An electrostatic discharge (ESD) protection circuit structure comprising:
a dual directional silicon controlled rectifier (SCR) formed in a substrate, the dual directional SCR including:
first and second P-wells laterally interposed by an N-well;
a deep N-well disposed underneath the P-wells and the N-well;
first and second N-type regions in the first and second P-wells, respectively, the first and second N-type regions coupled to a first pad and to a second pad, respectively; and
first and second P-type regions in the first and second P-wells, respectively, the first and second P-type regions coupled to the respective first and second pads and disposed closer to the N-well than the first and second N-type regions, respectively.

2. The ESD protection circuit structure of claim 1, wherein the dual directional SCR further includes:
a first isolation region disposed between the first N-type region and the first P-type region; and
a second isolation region disposed between the second N-type region and the second P-type region.

3. The ESD protection circuit structure of claim 1 wherein:
the first and second P-type regions are heavily doped P+ regions; and
the first and second N-type regions are heavily doped N+ regions.

4. The ESD protection circuit structure of claim 3 fabricated in accordance with a 0.18 μm CMOS process wherein the N+ regions and the P+ regions are doped at concentrations between $10^{15}$ and $10^{16}$ ion/cm².

5. The ESD protection circuit structure of claim 3 fabricated in accordance with a 0.13 μm CMOS process wherein the N+ regions and the P+ regions are doped at concentrations between $2 \times 10^{15}$ and $3 \times 10^{16}$ ion/cm².

6. The ESD protection circuit structure of claim 1 wherein:
the first N-type region, the first P-well, and the N-well form a first parasitic bipolar NPN transistor;
the first P-well, the N-well, and the second P-well form a parasitic bipolar PNP transistor; and
the N-well, the second P-well, and the second N-type region form a second parasitic bipolar NPN transistor.

7. The ESD protection circuit structure of claim 1 wherein the dual directional SCR is configured to provide a trigger voltage in excess of 7 V.

8. The ESD protection circuit structure of claim 7 wherein the first and second N-type regions and the first and second P-type regions all have lengths between about 6 μm and 80 μm and widths between about 0.8 μm and 5 μm.

9. The ESD protection circuit structure of claim 8 wherein the first and second N-type regions and the first and second P-type regions all have length-to-width ratios of about 15:1.

10. The ESD protection circuit structure of claim 1, wherein the dual directional SCR is configured to provide a holding voltage of at least 4.5 V.

11. The ESD protection circuit structure of claim 10 wherein:
the first and second P-type regions are each separated from the N-well by a separation distance of between about 0.43 and 3 µm; and
the N-well has a width between about 0.86 and 3 µm.

12. The ESD protection circuit structure of claim 11 wherein:
the ratio of the separation distance to the width of the N-type and P-type regions is between about 0.5 and about 3.0; and
the ratio of the width of the N-well to the width of the N-type and P-type regions is between about 0.3 and about 3.0.

13. The ESD protection circuit structure of claim 10 wherein:
the first and second P-type regions are each separated from the N-well by a separation distance of between about 0.38 and 3 µm; and
the N-well has a width between about 0.8 and 3 µm.

14. The ESD protection circuit structure of claim 13 wherein:
the ratio of the separation distance to the width of the N-type and P-type regions is between about 0.5 and about 3.0; and
the ratio of the width of the N-well to the width of the N-type and P-type regions is between about 0.3 and about 3.0.

15. An RFID tag having dual directional ESD protection comprising:
a core RFID module; and
a dual directional silicon controlled rectifier (SCR) formed in a substrate, the dual directional SCR including:
first and second P-wells laterally interposed by an N-well,
a deep N-well disposed underneath the P-wells and the N-well,
first and second N-type regions in the first and second P-wells, respectively, the first and second N-type regions coupled to a first pad and to a second pad, respectively, and
first and second P-type regions in the first and second P-wells, respectively, the first and second P-type regions coupled to the first and second pads, respectively, and disposed closer to the N-well than the first and second N-type regions, respectively;
wherein the dual directional SCR is configured to provide a trigger voltage in excess of 15 V.

16. The RFID tag of claim 15, wherein the dual directional SCR is configured to provide a holding voltage of at least 4.5 V.

* * * * *